US007906775B2

(12) United States Patent
Heath et al.

(10) Patent No.: US 7,906,775 B2
(45) Date of Patent: Mar. 15, 2011

(54) SUPERLATTICE NANOPATTERNING OF WIRES AND COMPLEX PATTERNS

(75) Inventors: James R. Heath, South Pasadena, CA (US); Pierre M. Petroff, Santa Barbara, CA (US); Nicholas A. Melosh, Menlo Park, CA (US)

(73) Assignee: California Institute of Technology, Pasadena, CA (US)

( * ) Notice: Subject to any disclaimer, the term of this patent is extended or adjusted under 35 U.S.C. 154(b) by 1135 days.

(21) Appl. No.: 11/633,043

(22) Filed: Dec. 4, 2006

(65) Prior Publication Data
US 2010/0258785 A1 Oct. 14, 2010

Related U.S. Application Data

(63) Continuation of application No. 10/521,714, filed as application No. PCT/US03/23546 on Jul. 28, 2003, now Pat. No. 7,161,168.

(60) Provisional application No. 60/399,594, filed on Jul. 30, 2002.

(51) Int. Cl.
*H01L 21/02* (2006.01)
(52) U.S. Cl. .......................... 257/15; 977/755
(58) Field of Classification Search .......... 977/762, 977/755, 773; 257/15, 9; 438/669
See application file for complete search history.

(56) References Cited

U.S. PATENT DOCUMENTS

| 6,231,744 B1 | 5/2001 | Ying et al. |
| 6,294,450 B1 | 9/2001 | Chen et al. |
| 6,359,288 B1 | 3/2002 | Ying et al. |
| 6,407,443 B2 | 6/2002 | Chen |
| 6,465,132 B1 | 10/2002 | Jin |
| 2003/0008505 A1 | 1/2003 | Chen |
| 2003/0219992 A1 | 11/2003 | Schaper |
| 2005/0128788 A1* | 6/2005 | Segal et al. .............. 365/151 |

OTHER PUBLICATIONS

Battiston, F.M., J.P. Ramseyer, et al. (2001), "Chemical Sensor Based on a Microfabricated Cantilever Array with Simultaneous Resonance-Frequency and Bending Readout", Sensors and Actuators B-Chemical 771(1-2): 122-131.
Cleland, A.N. and M.L. Roukes (1996); "Fabrication of High Nanometer Scale Mechanical Resonators and Bulk Si Crystals", Applied Physics Letters 69 (18): 2653-2655.
Collier, C.P., J.O. Jeppesen et al. (2001), "Molecular-Based Electronically Switchable Funnel Junction Devices", Journal of the American Chemical Society 123 (50): 12632-12641.
Cui, Y., Q.Q. Wei, et al. (2001), "Nanowire Nanosensors for Highly Sensitive and Selective Detection of Biological and Chemical Species", Science 293 (5533): 1289-1292.
Erbe, A. and R.H. Blick (1999), "Nanomechanical Resonators Operating at Radio Frequencies", Physica B. 272 (1-4): 575-577.

(Continued)

*Primary Examiner* — Thao P. Le
(74) *Attorney, Agent, or Firm* — Steinfl & Bruno LLP

(57) ABSTRACT

Fabrication of metallic or non-metallic wires with nanometer widths and nanometer separation distances without the use of lithography. Wires are created in a two-step process involving forming the wires at the desired dimensions and transferring them to a planar substrate. The dimensions and separation of the wires are determined by the thicknesses of alternating layers of different materials that are in the form of a superlattice. Wires are created by evaporating the desired material onto the superlattice that has been selectively etched to provide height contrast between layers. The wires thus formed upon one set of superlattice layers are then transferred to a substrate.

6 Claims, 13 Drawing Sheets

OTHER PUBLICATIONS

Guo, L.J., P.R. Krauss, et al. (1997): "Nanoscale Silicon Field Effect Transistors Fabricated Using Imprint Lithography", Applied Physics Letters 71 (13): 1881-1883.

Kong, J., N.R. Franklin, et al. (2000), "Nanotube Molecular Wires as Chemical Sensors", Science V287 (N5453): 622-625.

Kong, J., M.G. Chapline, et al. (2001), "Functionalized Carbon Nanotubes for Molecular Hydrogen Sensors", Advanced Materials V13 (N18): 1384-1386.

Lang, H.P., R. Berger, et al. (1998), "A Chemical Sensor Based on a Micromechanical Cantilever Array for the Identification of Gases and Vapors", Applied Physics a-Materials Science & Processing 66 (PT1 SUPPS): S61-S64.

Mohanty, P., D.A. Harrington, et al. (2000), "Measurement of Small Forces in Micron-Sized Resonators", Physica B 284 (PT2): 2143-2144.

Chou, Stephen Y., et al. (1996), "Imprint Lithography with 25-Nanometer Resolution", Science, vol. 272, pp. 85-87, Apr. 5, 1996.

Melosh, N.A., et al. (2003), "Ultrahigh-Density Nanowire Latices and Circuits", Science, vol. 300, pp. 112-115, Apr. 4, 2003.

US Restriction Requirement issued for U.S. Appl. No. 10/521,714 on Apr. 5, 2006 by the United States Patent Office.

Notice of Allowance issued for U.S. Appl. No. 10/521,714 on Nov. 7, 2006 by the United States Patent Office.

* cited by examiner

SUPERLATTICE NANOPATTERNING OF WIRES AND COMPLEX PATTERNS

CROSS-REFERENCE TO RELATED APPLICATION

This application is a continuation of U.S. application Ser. No. 10/521,714, filed Jan. 19, 2005 (now U.S. Pat. No. 7,161, 168), and claims priority to PCT Application No. PCT/US03/23546 filed Jul. 28, 2003, and U.S. Provisional Application No. 60/399,594, filed Jul. 30, 2002, the entire contents of which are incorporated herein by reference.

STATEMENT REGARDING FEDERALLY SPONSORED RESEARCH OR DEVELOPMENT

This invention was made with support from the Defense Advanced Research Projects Agency (DARPA) Grant #MDA972-01-3-0005. The government has certain rights in this invention.

The U.S. Government has a paid-up license in this invention and the right in limited circumstances to require the patent owner to license others on reasonable terms as provided for by the terms of ARO funding under Grant No. MDA972-01-3-0005.

BACKGROUND OF THE INVENTION

1. Field of the Invention

The present invention involves the production of electronic and mechanical devices with length scales measured in nanometers to microns. More particularly, the invention encompasses complicated electrical circuits, mechanical devices, and spatially modulated physical properties. Currently, similar devices (with larger feature sizes) are fabricated using photolithography and related processes often employed by the semiconductor industry.

2. Description of Related Art

The silicon integrated circuit industry (IC) has dominated electronics and has helped it grow to become one of the world's largest and most critical industries over the past thirty-five years. However, because of a combination of physical and economic reasons, the miniaturization that has accompanied the growth of Si IC's is reaching its limit. The present scale of devices is on the order of tenths of micrometers. New solutions are being proposed to take electronics to even smaller levels; such solutions are directed to constructing nanometer scale devices.

Prior proposed solutions to the problem of constructing nanometer scale devices have involved (1) utilization of extremely fine scale lithography using X-rays, electrons, ions, or scanning probes to define the device components; (2) direct writing of the device components by electrons, ions, or scanning probes, or (3) using a master fabricated with either process (1) or (2) to stamp the device components into a conformal layer. The major problem with (1) is the capital expense necessary to build equipment capable of fabricating devices on the nanometer lengthscale. The properties of light at these length scales require expensive optical components, as well as precision translation stages and alignment equipment. Indeed, some components necessary to produce 30 nm photolithographic structures have not even been invented yet. While (2) avoids some of these obstacles by using charged particles instead of light, the processing is inherently serial. Writing a wafer full of complex devices, each containing trillions of components, could well require many years. Process (3) is an alternative to conventional lithography, using a master stamp to imprint a pattern into a film, such as polymethyl(methacrylate). As currently practiced, however, so-called nano-imprinting is still dependent upon photo- or e-beam lithography to define the master stamp. Processes (1-3) are all limited with respect to the density of features that can be patterned. While very small structures (wires and discs), with a smallest dimension of 10 to 20 nanometers, can be patterned using various of the above techniques, it is very difficult to fabricate such small structures at a high density. The distance that separates the individual structures, known as the 'pitch' is typically limited to about 60 nanometers or greater. The invention described in detail below generates extremely well-defined conducting nanowires, and at densities that are well-beyond the current state-of-the-art. The invention may be utilized within the stamping motif of Process (3), however with a non-lithographically defined master that allows much smaller features to be produced.

A related, but distinctly different approach has been described by Chen & Williams (U.S. Pat. No. 6,407,443 "Nanoscale Patterning for the Formation of Extensive Wires,"). In their approach, a differentially etched silicon germanium superlattice is utilized as a stamp to produce nanoscale wire patterns in a polymer mold. Subsequent processing steps are then utilized to develop the wires into conducting materials. The subsequent processing steps, such as polymer removal, pattern etching, and metal deposition are very difficult to control at nanoscale dimensions, and so it is very difficult to transfer the atomic-level control that is realized in the superlattice structure into the final pattern of nanostructures. In the current invention, the nanowires are deposited directly onto the superlattice, and then transferred, as if they were an ink, onto the substrate, without any additional processing. This allows for the full atomic fidelity of the superlattice to be utilized. In many applications, such as those that require the mechanical or chemical properties of the nanowires, small variations in nanowire structure can lead to large variations in mechanical or chemical properties. The present invention uniquely avoids such physical properties variations in the nanowires.

There remains a need for a basic approach to form nanometer-scale devices that can be used to form more complex circuits and systems, and that scale readily and inexpensively down to nanometer scale dimensions.

SUMMARY OF THE INVENTION

The invention detailed below uniquely addresses the problems encountered in current efforts to fabricate devices with features on the nanometer length-scale by translating the difficulty of defining nanometer lateral spatial dimensions to a problem of controlling the thicknesses of alternating thin films.

The invention is based upon a structure of alternating thin film layers, known as a superlattice, to define lateral feature sizes. Here after, we will label the superlattice nanopatterning (SNAP) of wires and complex patterns as the SNAP process. An example of a superlattice is a stack of GaAs/Al$_x$Ga$_{1-x}$As ($0.5 < x < 1$) layers, deposited by molecular beam epitaxy (MBE) or metalorganic chemical vapor phase deposition (MOCVD) onto a suitable substrate, with atomic monolayer thickness control. The method described below is not limited to a particular superlattice. Any structure of alternating layers of non-identical materials (metals, semiconductors, compound semiconductors, ceramic, insulators or organic layers) can serve as a superlattice template for this process. To define useful lateral features based on the superlattice template, a small amount of one layer of the superlattice is selectively removed from the polished cross section of the superlattice. The alternating layer heights thus created then serve as the lateral template. In particular, deposition of material selectively onto one layer allows for the formation of nanowires that are at the width and separation that is determined by the superlattice spacings. Such spacings can be controlled down to atomic dimensions. Material selectively deposited onto the superlattice can be subsequently transferred to a substrate by simple contact and release processing, as described below, and this is the main feature of the present invention.

In accordance with the present invention, a superlattice is provided that includes a template portion. The template portion is composed of a plurality of parallel channels wherein each of the channels includes two channel sidewalls that each have an upper edge and a lower edge. The channels each further include a channel bottom that extends between the lower edge of the channel sidewalls. The channel sidewalls and channel bottom form a plurality of trenches. The template portion further includes a plurality of top surfaces that extend between the upper edges of the channel sidewalls of adjacent channels. The top surfaces form plateaus or mesas that are located between the channels. The top surfaces and channel sidewalls are composed of a material that is different from the channel bottom.

As one feature of the present invention, one or more wire-forming materials are applied to the template portion of the superlattice to form coatings that cover only the top surfaces. These coatings can then be transferred as wires of material to a suitable substrate. The invention also covers applying one or more wire-forming materials to the template portion in such a way that the resulting coating covers only the top surfaces and a portion of the channel sidewalls. In this embodiment, angular shaped wires of material are formed that are suitable for transfer to a substrate. The wire-forming material can also be applied to the template portion so that only the channel bottoms and possibly a portion of the channel sidewalls are covered with material.

This technique to form nanometer scale features has several advantages over traditional approaches. First, the difficulty of defining nanometer scale patterns using photolithography due to the fundamental physical properties of light and electron beams are completely avoided, as there is little problem producing superlattices with arbitrary thick (or thin) layers and periodicity. In addition, the extremely expensive fabrication facilities required for nanometer photolithography are not needed, as the precise positioning tools and special optics required for photolithography at these scales are obviated. Second, unlike e-beam lithography or ion-milling, the superlattice approach is not serial, and can be performed repeatedly to form complex patterns. For mass production purposes, the superlattice process can be applied to form a 'master,' in another material if desired (for additional toughness for instance), to template very complicated structures in one step. Third, the superlattice technique can be used to directly deposit fully formed metallic wires, without the lift-off processing steps used in both photo- and e-beam lithography. This is an important advantage, as complete removal of excess metal in the lift-off step is a very challenging for nanometer features, often causing complete loss of the device and lowering overall yields.

Fourth, using ion beam with a fine probe diameter (7-10 nm), the superlattice template can be shaped to form a SNAP master stamp with very complex geometries.

Finally, the actual wires and wire assemblies that can be produced using this technique have intrinsic characteristics that arise from their nanoscale dimensions and/or their ultra-high densities. These characteristics involve both the mechanical and chemical properties of the individual nanowires, as well as the collective mechanical and chemical properties of the nanowire assemblies.

The above discussed and many other features and attendant advantages of the present invention will become better understood by reference to the detailed description when taken in conjunction with the accompanying drawings.

BRIEF DESCRIPTION OF THE DRAWINGS

FIG. 6a shows a crossbar assembled by sequential deposition of two sets of Pt wires at 90° to one another. Notice the high fidelity of the wires, and the multiple length scales this technique can address at one time. The lattices shown have the same wires and spaces as in FIG. 3a.

DETAILED DESCRIPTION OF THE INVENTION

Definitions

A 'superlattice' is defined as a stack of alternating layers of non-identical materials. This includes, but is not exclusive to, semiconductors, metals, insulators, organic and ceramics. The superlattice may have several different types or composition of layers, with a minimum of two.

A 'master' is a pattern or template that is used repeatedly to pattern other surfaces. A rubber stamp is an example of a master, used to repeatedly transfer an ink pattern to a paper substrate.

Thicknesses of $GaAs/Al_xGa1-_xAs$ ($0.5<x<1$) layers are labeled as xx/yy nm, denoting xx nm wide GaAs layers alternating with yy nm wide AlGaAs layers. The same notation will be used for the width of the deposited wires and the spaces in between. Thus, 10/20 nm Pt wires denotes 10 nm wide Pt wires with 20 nm space between each wire, for a total center-to-center distance of 30 nm. The 'pitch' of a set of wires is then defined as the center-to-center distance of each wire.

Superlattice Templating

The SNAP processing method is based on the idea of using the physically and chemically distinct layers of a superlattice to define a spatial template or pattern that can be 'developed' by selectively depositing nanowires onto one component of the superlattice. The nanowires may then be transferred to virtually any substrate. This approach is quite unique from all other approaches to define nanometer to micron scale patterns, which ultimately rely upon light or energetic particles to define features. Techniques such as e-beam lithography or ion beam milling both use a collimated beam of electrons or ions to produce patterns, and are written serially. Photolithography relies upon a mask fabricated by laser ablation, photo- or e-beam lithography to selectively block light from a photoresist layer. The SNAP processing method avoids all the proximity effects that are inherent to the previously mentioned lithography techniques. Consequently, the use of a superlattice as a physical or chemical template is unique, and can produce much smaller features that are more closely spaced than any other lithographic method currently available. Another unique feature associated with the SNAP process is the obtention of very sharp angles between nano patterned features. This is again due to the absence of proximity effects found in conventional lithography processes.

Figure 1:
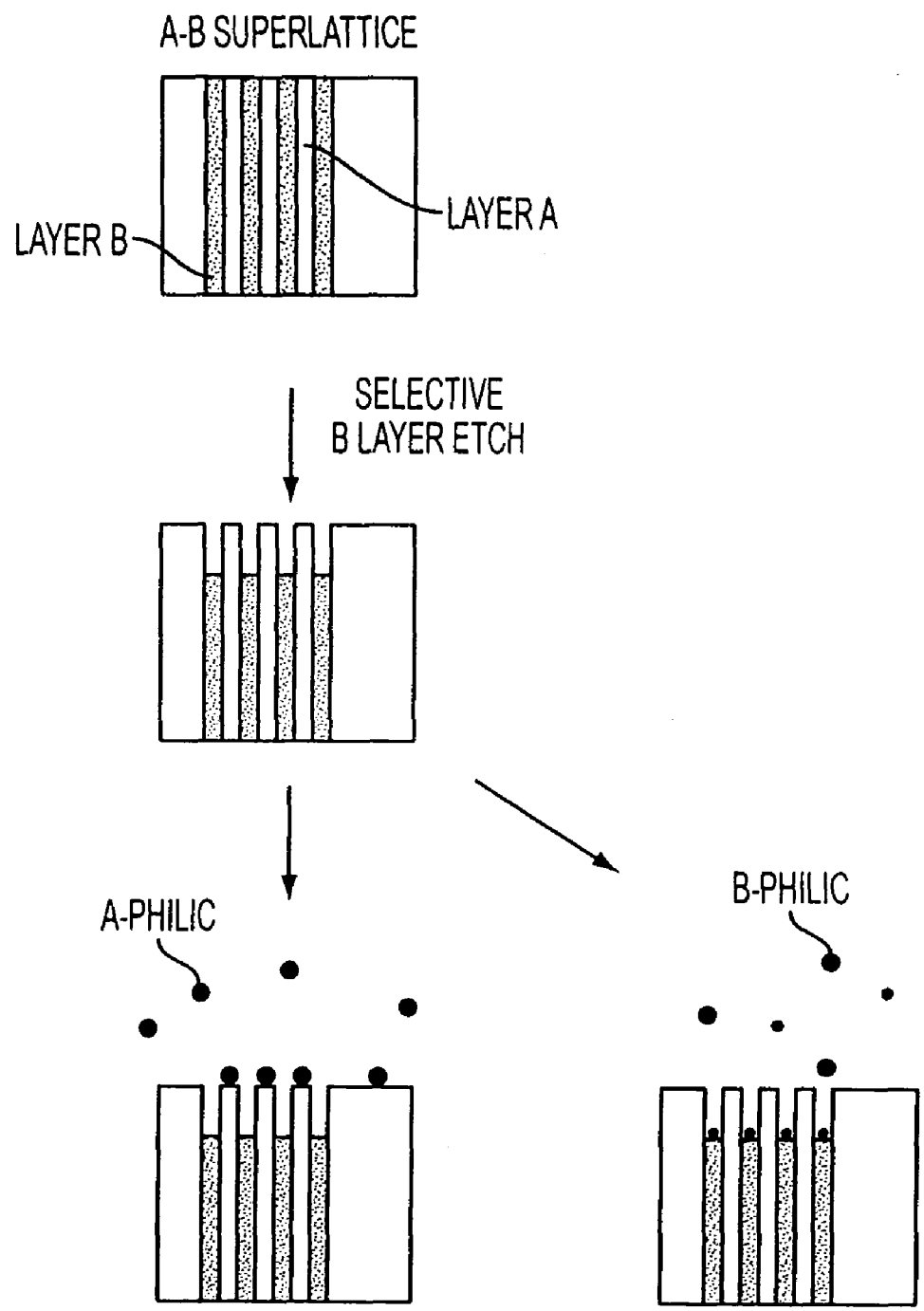
FIG. 1 is a process flow diagram for the use of the superlattice as a physico-chemical template.

Several exemplary methods that use the superlattice templating technique in accordance with the present invention are described herein. The methods are based upon the differentiation provided by the alternating physical and chemical properties of the superlattice. First, the sharp chemical differentiation between selectively etched superlattice layers, designated A and B in FIG. 1, can direct self-assembly or attachment of chemical or biological species, which are very sensitive to the local chemical potentials. For instance, after selectively etching layer B (AlGaAs), nanoparticles coated with alkylthiols will attach solely to the top of the GaAs layers (layer A), forming strings or lines of nanoparticles with well-defined spaces in between, see FIG. 1. If the species to be attached preferentially binds to the etched layer, the spacing of the superlattice can serve as a size-selective filter, only allowing species smaller than the layer thickness to deposit. By synthesizing several different superlattices, this technique may allow size selective separation of a variety of species.

Secondly, the superlattice can be used to template wires with sizes and pitches in the nanometer size range. Using the method described here, we have made gratings of trenches and mesa wires with periodicity as small as 1 nm/2 nm. This method utilizes simple physical transfer of fully formed wires from a selectively etched superlattice onto an appropriate substrate. The wires are formed by evaporating metal (or other material) directly upon one layer of the superlattice, after selective removal of the other layer(s) to create trenches. By depositing the metal solely upon one superlattice layer, the wire widths are defined by the thicknesses of these layers, and conversely the separation between the wires by the thicknesses of the other layers. Thus, the lateral wire dimensions are controlled by the film thicknesses of the superlattice. Well-defined wires can be readily fabricated down to 8 nm widths or less in this manner. A schematic flow diagram for this process is depicted in FIG. 2.

To form the wires, often of metal, a given material is selectively evaporated onto the top of the GaAs layers by tilting the superlattice with respect to the evaporative flux. This declination allows the evaporated material to be deposited only upon the GaAs layers, due to their relative elevation to the etched AlGaAs layers. FIG. 2 shows a sketch of the incident flux onto a tilted wafer, clearly showing how the material deposits onto only one superlattice layer. Any material that can be deposited directionally may be used with this technique. This includes, but is not exclusive to: metals, semiconductor compounds, ceramics, and organics. Gold, chromium, aluminum, platinum, titanium, niobium, bismuth, and nickel wires have all been demonstrated. Other organic materials, such as pentacene wires, have been demonstrated using this technique. In addition, the functionality of the deposited wires can be enhanced by evaporating multiple materials upon the same substrate, forming poly-metallic or composite wires. For example, bismuth/platinum and bismuth/chromium multi-layered wires have been demonstrated. These multiple-layer wires may have additional uses besides conductive wires, such as rectifying, sensing, thermoelectric, mechanical resonator, or chemical applications.

Figure 2:
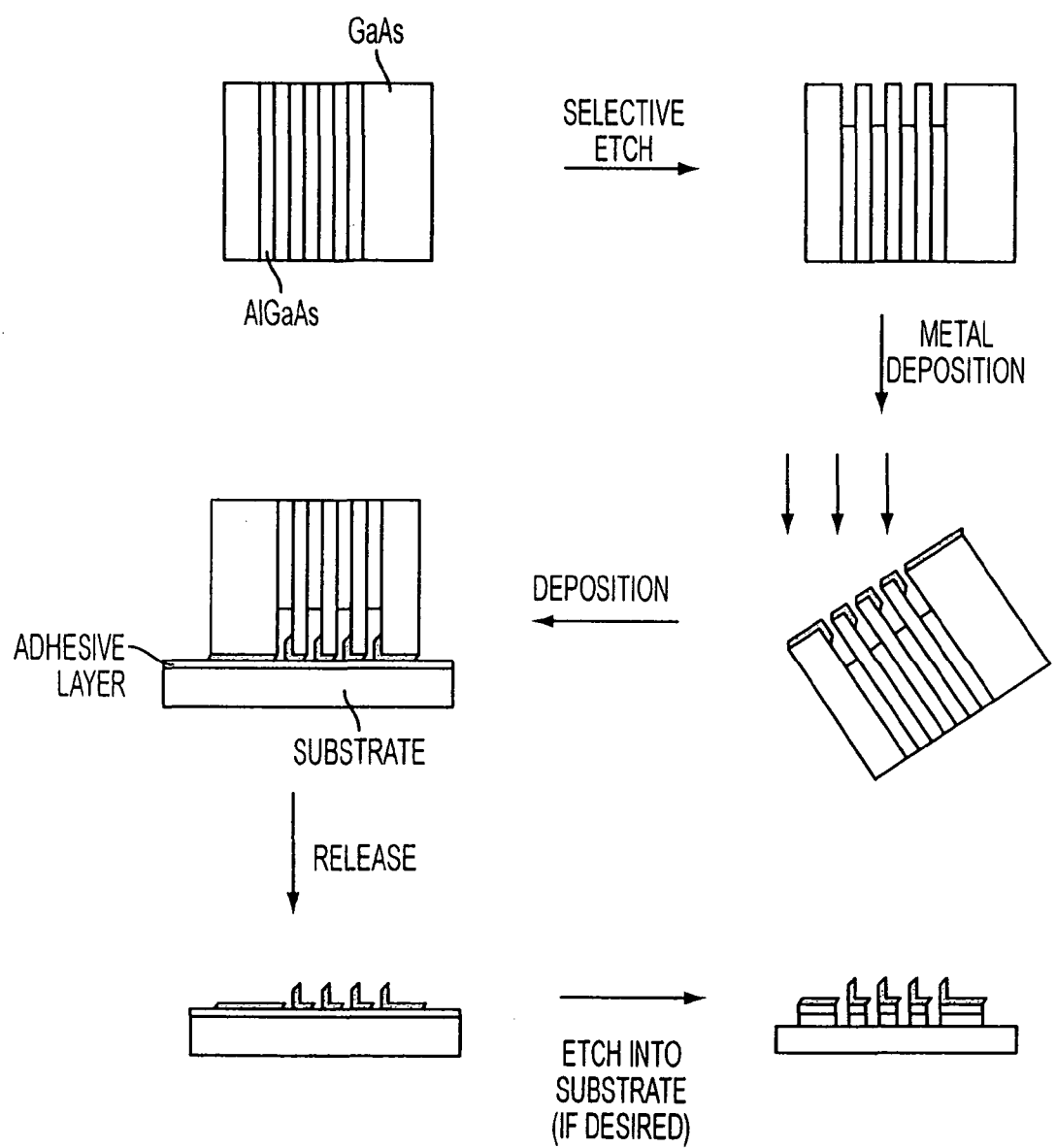
FIG. 2 is a process flow diagram for the superlattice wire deposition technique detailed herein.

The wires evaporated onto the superlattice are transferred to a planar substrate by contacting the coated superlattice to an adhesive layer on the substrate, as illustrated in FIG. 2. Several variants of this process can be used. The adhesive layer can range widely—including polymers, pre-polymers, epoxies, or molecular films. In some cases, an adhesive layer may not be necessary, relying instead on electronic, thermodynamic, or van der Waals forces to attach the wires to the substrate. The substrate material is also high variable, and, in some cases, is not even necessary. The superlattice typically does not need to contact the substrate surface directly, rather only to make uniform contact with the adhesive layer. The substrate requirements are therefore predicated upon the thickness of the adhesive layer—generally the surface roughness of the substrate must be less than the thickness of the adhesive layer. The substrate surface chemistry may vary widely as well, so long as it maintains good adhesion with the material used as the adhesive layer. This enables use of non-conventional substrates such as plastics, ceramics, metals, or organics. The use of a substrate could also be avoided entirely by using curable adhesives, such as epoxy or pre-polymers, to encapsulate the wires directly.

Physically contacting the superlattice sample to the adhesive layer may be carried out with a number of techniques. It is only required that the superlattice makes even contact with the adhesive layer with some amount of pressure. The manner in which this is performed can vary substantially. The simplest method is to place the superlattice on top of the substrate, and let its own weight create conformal contact. Application of pressure to the superlattice at this point can provide additional control over the bonding between the wires and the adhesive layer. Sophisticated alignment and contact devices, such as nano-imprinters, wafer bonders, photomask aligners and ball presses can all be used to modify this basic step to achieve slightly enhanced contact between the superlattice and the substrate.

At this point, the wires must be released from the superlattice. The release technique also has a number of variants, depending upon the exact materials used. For the GaAs/AlGaAs superlattices, a dilute GaAsO$_x$ etch will remove the oxidized surface layer on the GaAs layers, freeing the metal wires. Bi-metallic wires can also be used, with the first layer serving as a sacrificial layer which is etched to release the other layers. In this manner the original superlattice is completely unharmed by multiple wire depositions, and can be used repeatedly. If the original superlattice is structurally damaged during this process, it may be polished according to standard procedures, and then re-used. If the wires have poor adhesion to the superlattice, a release etch may be completely unnecessary. Subsequent processing may be performed on the deposited wires, however at this point they are ready for use.

Useful post-processing includes using the wires as etch masks to etch into the substrate, as shown in the final step of FIG. 2. Complicated structures, crystalline and crystallographically aligned materials, polycrystalline materials or thick films that would not normally be possible to deposit onto a superlattice, as described above, may be patterned by growing these materials onto a substrate, and etched using the superlattice wire process as a mask. This is particularly useful for materials that cannot be directionally deposited, such as single-crystal silicon. Etching the pattern provided by these wires into a substrate is performed with common practices in the semi-conductor industry, such as wet-chemical or plasma etching. Other useful post-processing steps include using selective etch processes to remove the adhesive layer, which may be an undesirable material for the final application. For example, if the final application requires that additional materials be deposited or additional features be patterned, this is often accompanied by thermal treatment of the wafer. In such cases, an organic epoxy or molecular film adhesive layer may contaminate these subsequent steps, thus is removed, e.g. by $O_2$ plasma etching. Another useful post-processing step is to suspend the wires. In this way the wires are free to move or vibrate, and may serve as useful mechanical devices such as resonators.

Figure 3:
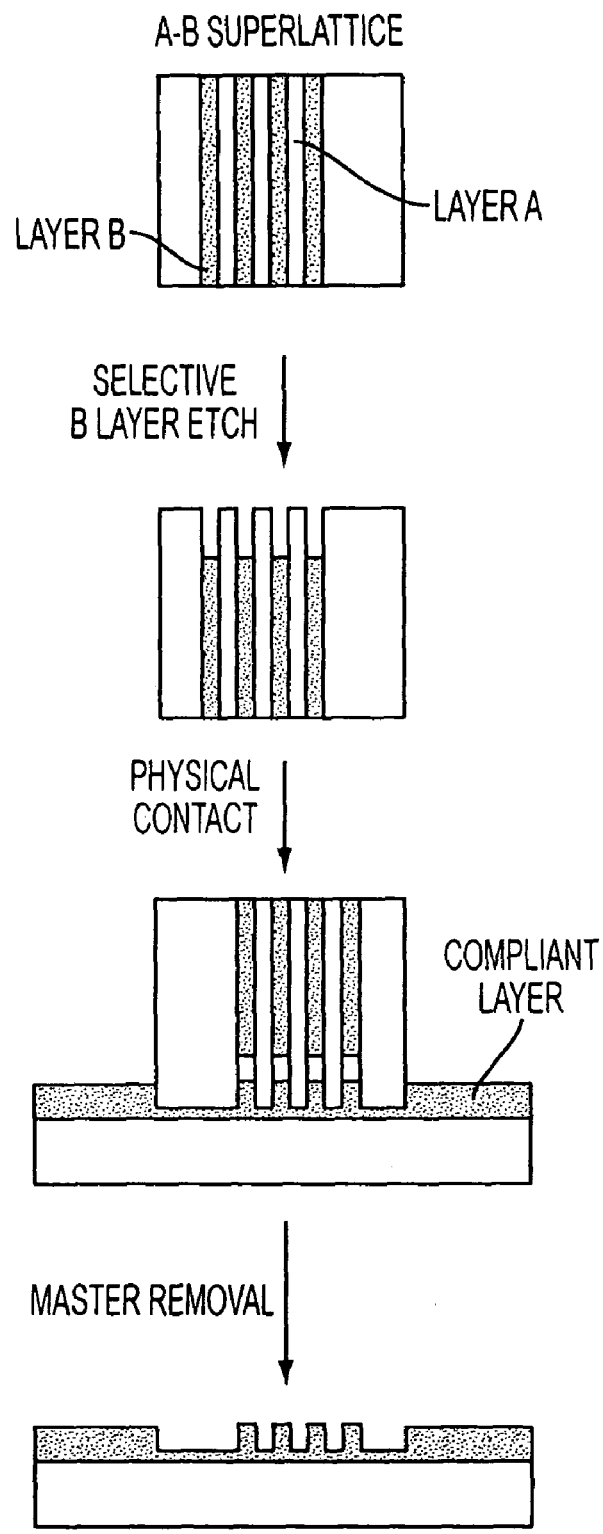
FIG. 3 is a process flow diagram for the use of the superlattice as a physical template.

Finally, the well-defined, square edges and trenches of the selectively etched superlattices serve as robust physical templates. Such nanometer scale physical gratings are useful for a number of applications, such as standards for scanning probe microscopy, or diffraction gratings for UV to X-ray wavelength light. The superlattices can also be used as master stamps for techniques such as nano-imprinting, or form molds using soft matter, such as PDMS. An illustration of this technique is shown in FIG. 3. We have demonstrated nano-imprinting into epoxy resins using the superlattice described above, and believe that it can be readily transferred to other conformal materials as well.

Reduction to Practice: Nanoscale Metal and Semiconductor Wires

As an example of the reduction to practice of this technique, we detail the fabrication of wires and circuits made of metal or silicon using GaAs/Al$_{0.8}$Ga$_{0.2}$As superlattices. Atomic level control over the thickness and composition of each layer was achieved by synthesizing some GaAs/AlGaAs superlattices via molecular beam epitaxy (MBE). One superlattice was composed of 5 sets of different layer thickness: 50/60, 30/50, 20/40, 10/20, and 5/15 nm GaAs/Al$_x$Ga$_{1-x}$As (0.5<x<1) widths, respectively. Each set is composed of eight GaAs layers, which become the templates for the metal wires. 300 nm GaAs buffer layers were grown between each set of layers to provide isolation. These buffer layers are not essential, demonstrated by its omission between the 50/60 and 30/50 nm sets. A second superlattice was grown and was composed of 2 sets of different layer thicknesses: 30/20 and 10/20 nm GaAs/Al$_x$Ga$_{1-x}$As widths, respectively. The 30/20 set consisted of 40 wire templates, and the 10/20 set consisted of 20 wire templates. A third superlattice was grown and was composed of 1 set of 8/8 nm GaAs/Al$_x$Ga$_{1-x}$As widths, respectively, and consisted of 20 wire templates.

Figure 4A:
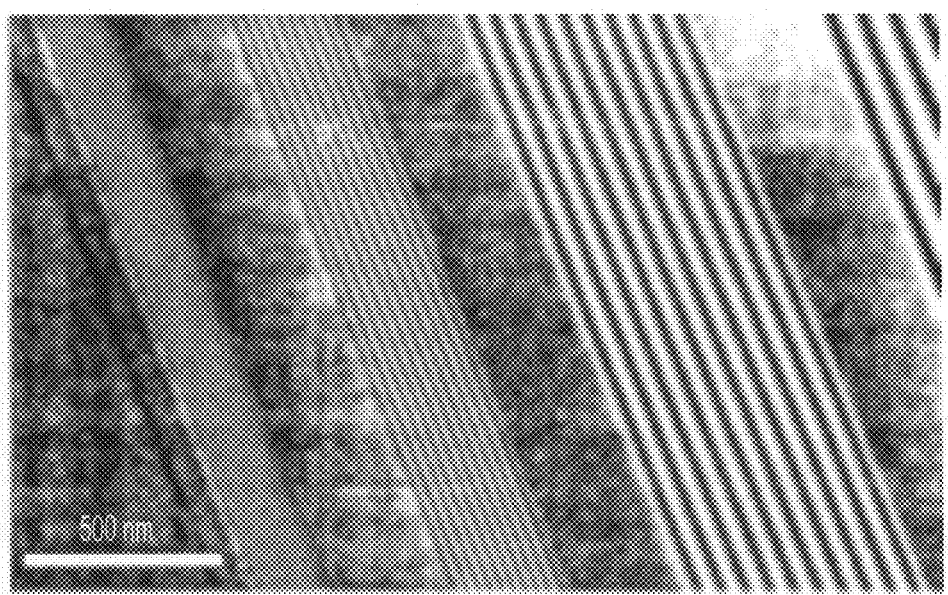
FIG. 4a is a scanning electron microscopy (SEM) image of a GaAs/AlGaAs superlattice after selective etching of the AlGaAs layers, viewed from above. The lattices shown are composed of mesas and trenches with dimensions of 5/15, 10/20, 20/40 nm respectively.
Figure 4B:
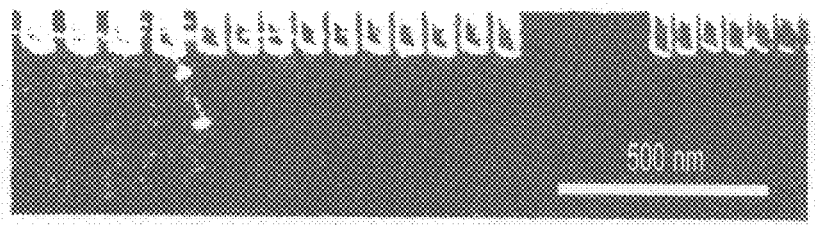
FIG. 4b is a SEM image of the same lattice, but viewed from the side to show the profile of the GaAs and AlGaAs layers after etching.

The first processing step to define the nanometer scale features in the superlattice is the selective removal of a small amount of one layer, as indicated in FIG. 2. Either GaAs or AlGaAs may be selectively etched, depending upon the etch chemicals used. For removal of AlGaAs, a dilute mixture of buffered HF acid (approx. 15 mL 6:1 buffered oxide etch to 50 mL H$_2$O) is used to etch a trench roughly 30 nm deep. Selective etching of the GaAs is achieved using etchants such as NH$_4$OH/H$_2$O$_2$/H$_2$O (5 ml:100 mL:1000 mL for 30% concentrations), or diluted mixtures of HCl/H$_2$O or other acids (~5 mL:100 mL). FIG. 4a is a scanning electron microscope (SEM) image of the superlattice after a selective AlGaAs etch. The AlGaAs layers appear dark, as they are at a lower elevation relative to the brighter GaAs layers. The image shows only the 20/40, 10/20 and 5/15 nm sets only. The topography of the etched layers is found by rotating the sample 90°, such that the surface profile is visible, as shown in FIG. 4b. Here the contrast is reversed, as the dark rectangles seen are the GaAs layers, and the depth of the AlGaAs trenches is easily observed. The high quality of the selective etch and the distinct, square profile of the GaAs layers shows the utility of this approach to prepare templates for nanometer scale devices.

We have also developed a chemo-mechanical processing method which permits the fabrication of superlattice areas as long as $10^7$ nm. The selective chemical polishing of the material in the trenches and removal of the chemical reaction by product is achieved using a slurry of silica particles with sizes as small as 100 nm. The pH of the chemical solution is chosen to remove preferentially GaAs in our case. However, another pH can be chosen to remove preferentially the AlGaAs.

To prepare metallic wires, ~30-150 Å of metal is evaporated onto the GaAs layers of the superlattice, tilted at 56° relative to horizontal. The precise angle at which the superlattice is tilted affects the thickness and shape of the deposited wires, and may be fine-tuned to achieve the desired properties. The thickness of the deposited metal can vary over a wide range, depending on the superlattice spacing and desired wire width. The wire-coated superlattice is then placed on top of a ~10 nm thick layer of epoxy, spun onto a suitable substrate such as silicon, silicon-on-insulator, silicon oxide, or other substrate the epoxy will adhere to. The epoxy is cured by heating to 135° C. for 30 min, forming a strong bond to the metal on the superlattice. Finally, the wires were freed from the superlattice with a GaAs-oxide etch, either dilute HCl or KI/I$_2$ solution.

Figure 5A:
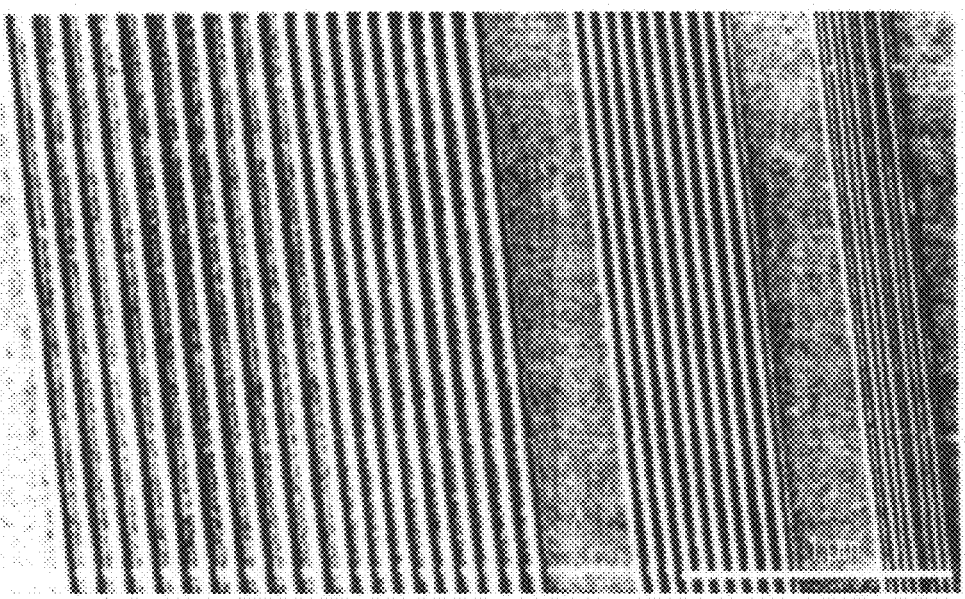
FIG. 5a is an SEM image of a set of Pt wires deposited with the technique described below, demonstrating the uniformity and quality possible with this method. The gradings of mesas and trenches shown are 50/60, 30/50, 20/40 and 10/20 nm, (note that not as many periods are visible in this figure) respectively.
Figure 5B:
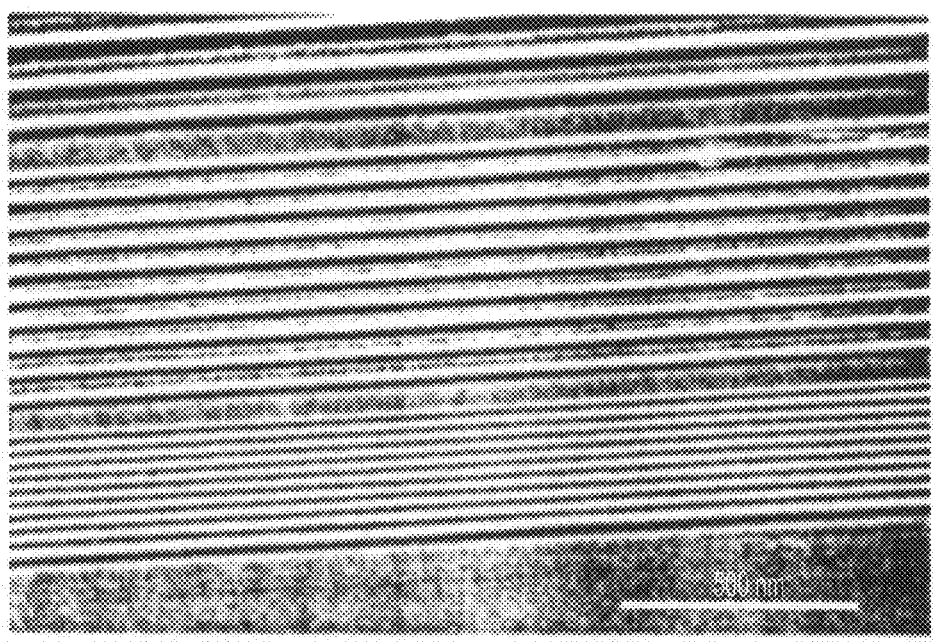
FIG. 5b is a higher magnification SEM image highlighting the quality of the 10 nm wide Pt wires at 30 nm pitch. The two sets of wires are 20/40 and 10/20 nm spacing.
Figure 5C:
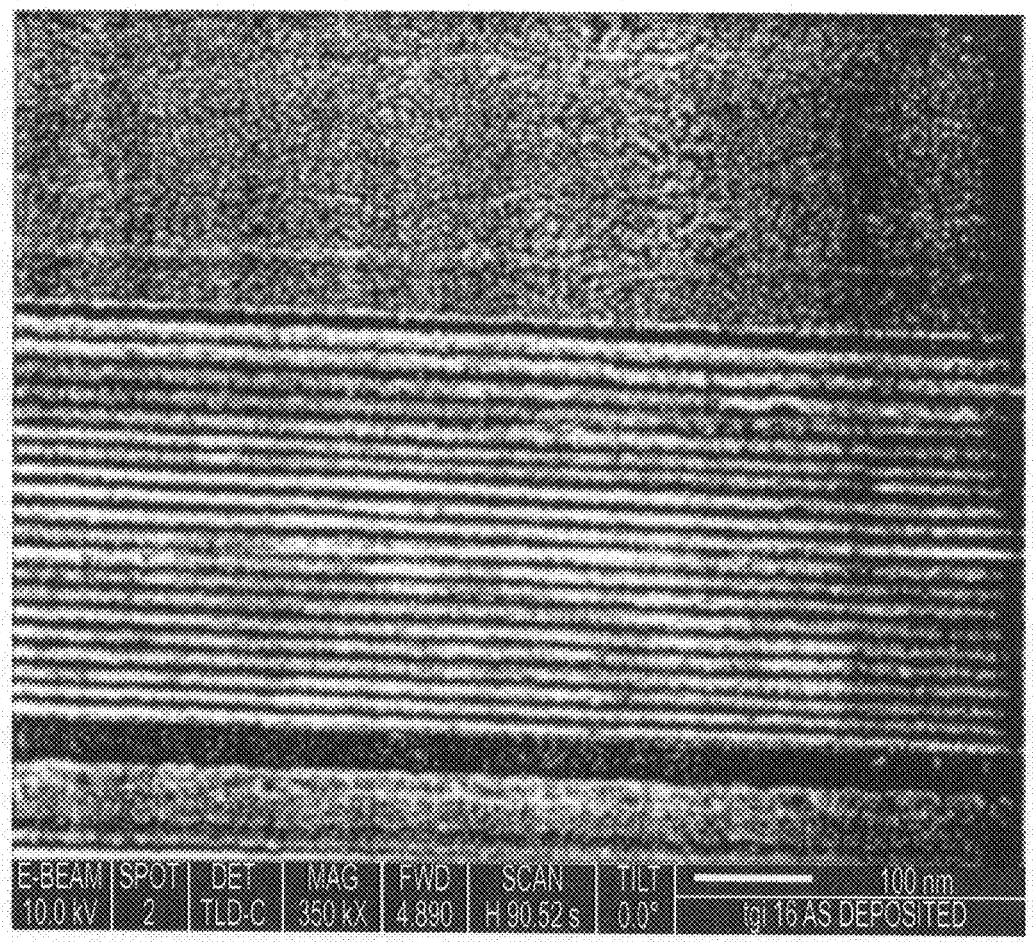
FIG. 5c is a higher magnification SEM image highlighting the quality of twenty 8 nm wide Pt wires at 16 nm pitch.

Wires deposited with this technique are uniform and continuous over the length of the GaAs superlattices (e.g. 2-3 mm), with nearly no defects. FIG. 5a presents a SEM image of four sets of Pt wires with 50/60, 30/50, 20/40, and 10/20 nm width/spacing. FIG. 5b shows a high magnification SEM image of 30/30 and 15/15 nm Pt wires, highlighting the precision of this technique at small length scales. FIG. 5c shows the 8/8 nm width/spacing wires patterned using a different superlattice master. For both FIG. 5b and FIG. 5c, the wires are straight, not touching, and show no visible defects over this entire span. The wires have distinct sidewalls, sharp edges and flat tops, attributed to the well-defined edges of the superlattice used to create these wires. Aside from gold wires, which are not structurally stable for long time periods, all of the metals examined are quite smooth and continuous. These characteristics are maintained for stretches greater than 100 micrometers in most areas.

Figure 6A:
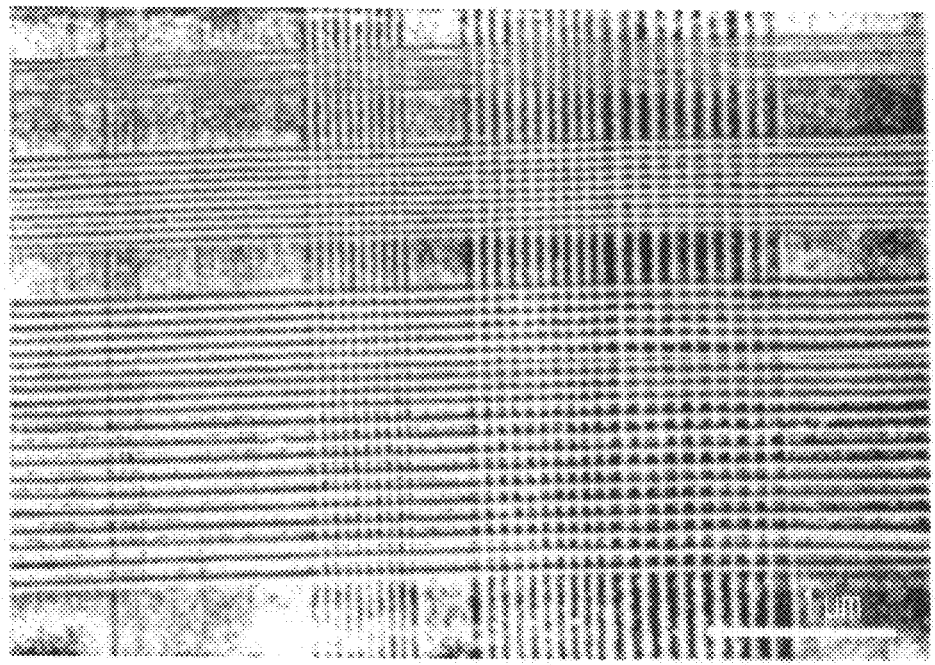
Figure 6B:
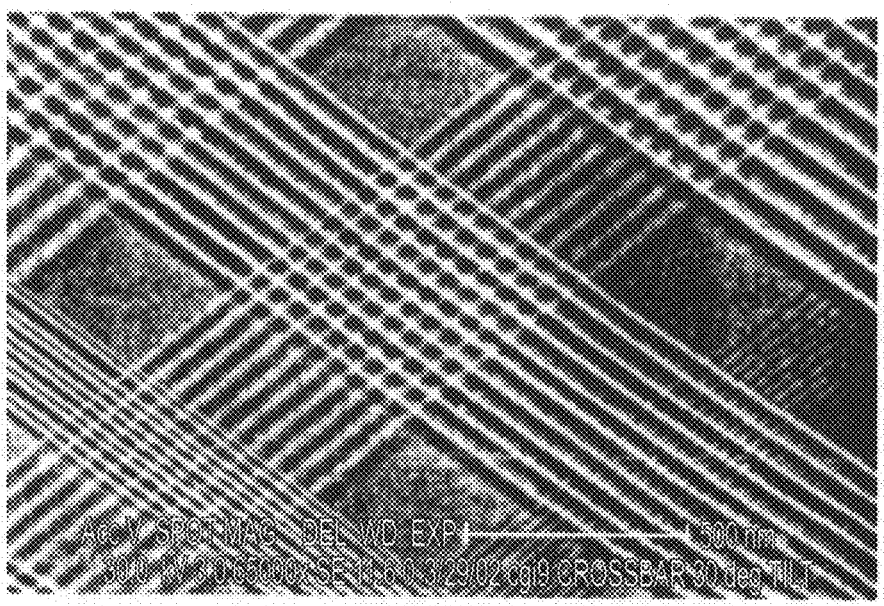
FIG. 6b is a higher magnification SEM image of FIG. 5a, that shows the alignment that is possible at 60 nm pitch in accordance with the present invention. The wires are 20 nm wide, with 40 nm gaps.

The process described above can also be utilized to form complex circuitry on nanometer length scales by repetition. One such structure is the crossbar—two sets of overlapping wires oriented roughly 90° to each other. These types of circuits are essential for memory applications, and can be exploited for logic gates as well. The benign conditions required for the art described here may allow application of this technique to molecular electronics and sensors as well as conventional metallic and semiconductor circuits. FIGS. 6a and 6b show scanning electron microscopy (SEM) images of a set of Pt crossbars, demonstrating the large range of length scales possible. FIG. 6a shows a crossbar made from two sets of 50/60, 30/50, 20/40, and 10/20 nm Pt wires, and the fidelity at all length scales. FIG. 6b is a magnification of the 20/40-20/40 crossing, displaying the accuracy with which the circuits may be produced. If used to construct a memory, these wires would produce a density of 300 gigabytes/$cm^2$, a hundred times denser than currently possible with semiconductor technology.

Figure 7:
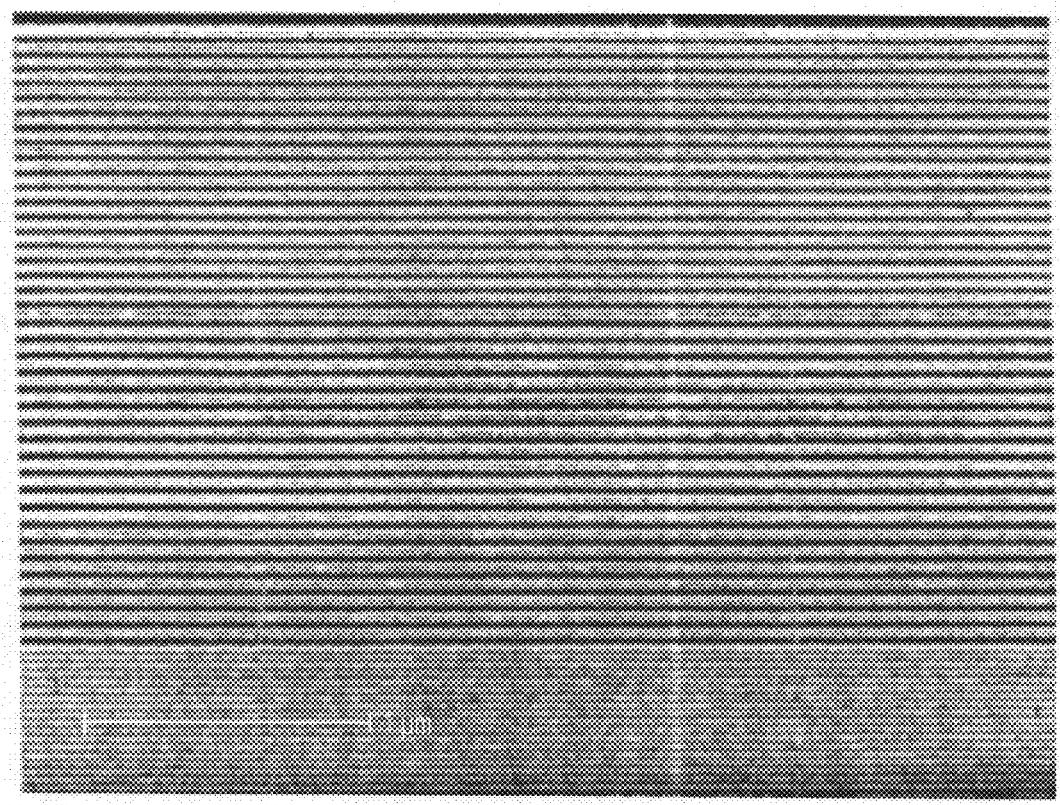
FIG. 7 is an SEM image of a set of forty 20 nm wide single crystal silicon wires patterned at a pitch of 60 nm, and twenty 20 nm wide wires patterned at a pitch of 30 nm. These wires were created by using the deposited metal wires as an etch mask. The wires were deposited onto a 50 nm thick single-crystal silicon-on-insulator film, and the excess silicon between the metal wires was removed by plasma etching.

Poly-silicon or single crystalline silicon wires can also be made using post-processing, an example of wires that could not normally be deposited with this method. First, a set of metal wires are deposited from the superlattice onto 50 nm of poly- or single crystal silicon, grown onto a silicon-dioxide substrate. Then a brief $O_2$-plasma etch is used to remove excess adhesive (epoxy in this case), followed by a $CHF_3/O_2$ plasma to etch the crystalline silicon layer underneath. The process is outlined in the final step of FIG. 2. The precise etch conditions are not central to the processing, and may be altered. This etch step removes the silicon between the metal wires, but not under them, effectively transferring the dimensions of the metallic superlattice wires to the silicon layer. Finally, the metal lines and epoxy are removed with a solution of concentrated 3 HCl:1 $HNO_3$, leaving only the poly- or single crystalline silicon wires. A SEM image of single crystal silicon wires made in this manner is shown in FIG. 7. The wires are 20 nm wide, with 40 wires at 30 nm spacing (60 nm pitch), and another 20 wires at 10 nm spacing (30 nm pitch). The attributes of these wires are similar to those of the metal wires—they are smooth and continuous, show well-defined edges and no contact between wires. This type of processing is extremely promising for fabrication of many crystalline semiconductor materials that cannot be directionally evaporated.

Figure 8:
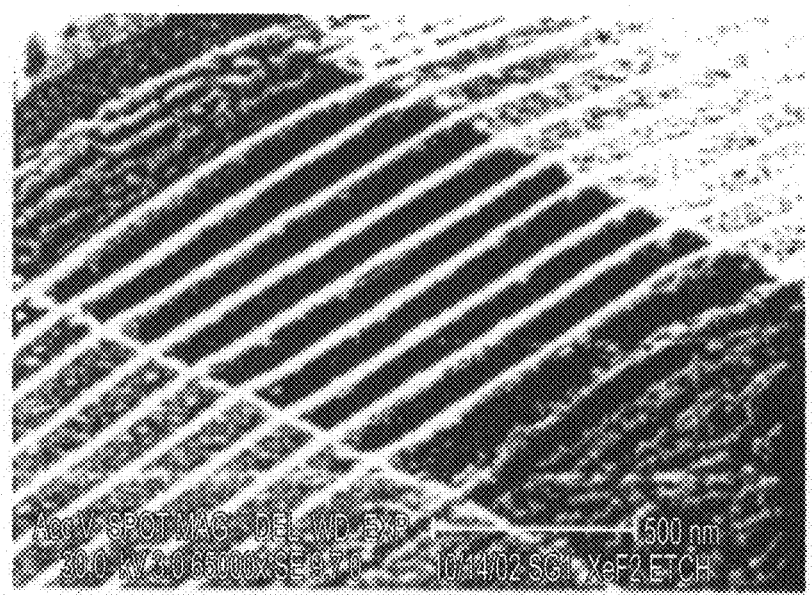
FIG. 8 shows wires created in accordance with the present invention suspended over a trench.

A demonstration that these wires are robust to further semiconducting processing steps was carried out by preparing suspended Pt wires, designed to act as resonators. Pt wire resonators were fabricated by selectively undercutting the supporting substrate, thus suspending the wires over a trench, as shown in FIG. 8. Here, 20 nm Pt wires at 150 nm pitch were deposited using the SNAP technique onto a bare silicon wafer. The adhesive epoxy layer was removed with an $O_2$ reactive ion etch plasma treatment. Poly(methylmethacrylate) (PMMA) electron beam resist was spun coat on top of the Pt wires, and trenches of various widths were patterned over the wires with electron beam lithography into PMMA. The exposed Si substrate beneath the wires was selectively etched away with $XeF_2$ gas.

To replicate the SNAP process over an entire wafer or selected areas of a wafer, the use of a stamping technique is preferred. FIG. 9 illustrates two possible approaches which both use stamps developed using the SNAP process.

In the first approach (FIG. 9a) a photoresist or other organic thin layer is embossed using the stamp and an adequate pressure. An anti-adhesion coating of the stamp material insures that the embossed layer does not stick to the stamp. In addition, a pattern transferred onto a rigid substrate via the SNAP process could also be used as the stamping master. This operation can then be repeated periodically on the desired areas of a large wafer.

Figures 9A, 9B:
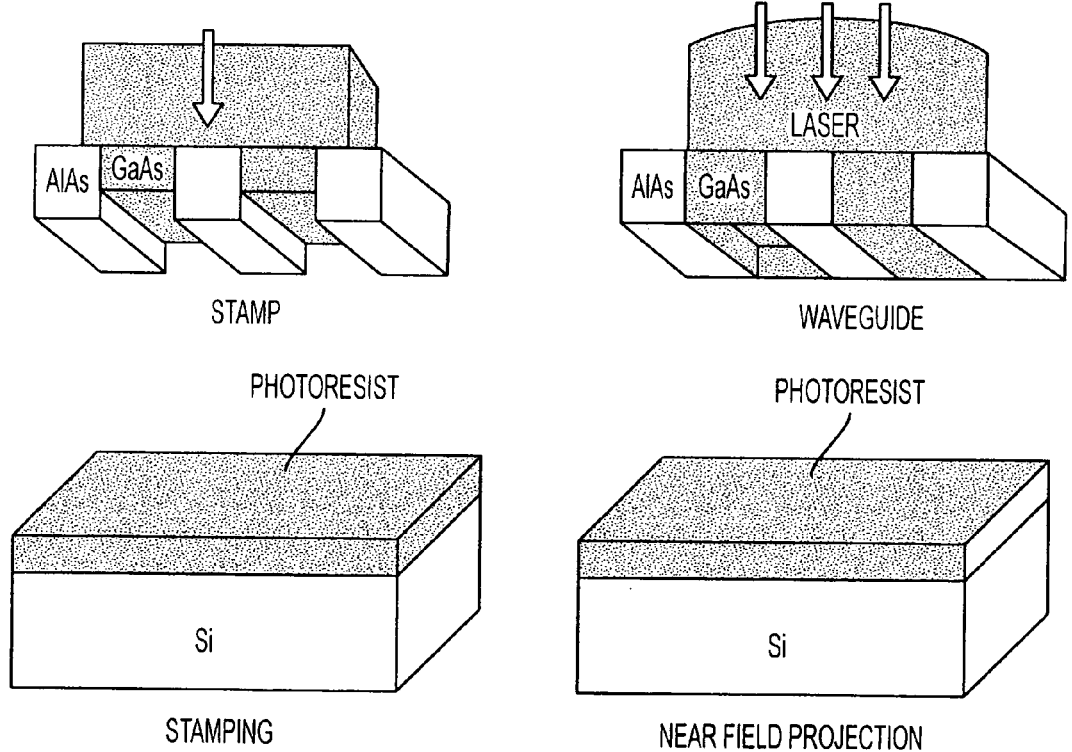
FIG. 9a details use of the superlattice patterning technique to produce features in a photoresist-type material using the physical imprint of the superlattice, similar to FIG. 3.
FIG. 9b demonstrates a technique to use near-field optical exposure of photoresist through a superlattice mask to define features smaller than the light wavelengths inherent diffraction limit.

The second method shown in FIG. 9b demonstrates the use of a stamp fabricated with the SNAP process to create near-field optical exposure of a photo-sensitive material. First the stamp is brought in proximity or contact with a thin photoresist. A laser or other light source is then used to expose the photoresist in near field optic conditions. The near field conditions insure that the resolution of the photoresist exposure is not limited by the wavelength of the light used. After developing, the exposed photoresist can be used to pattern trenches, wires or other structures on any type of substrate.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the above preferred embodiments and examples, but is only limited by the following claims.

REFERENCES

1. Battiston, F. M., J. P. Ramseyer, et al. (2001). "Chemical sensor based on a microfabricated cantilever array with simultaneous resonance-frequency and bending readout" Sensors and Actuators B-Chemical 77(1-2): 122-131.
2. Chou, S. Y., P. R. Krauss, et al. (1996). "Imprint Lithography with 25-Nanometer Resolution." Science 272 (5258): 85-87.
3. Cleland, A. N. and M. L. Roukes (1996). "Fabrication of High Frequency Nanometer Scale Mechanical Resonators from Bulk Si Crystals." Applied Physics Letters 69(18): 2653-2655.
4. Collier, C. P., J. O. Jeppesen, et al. (2001). "Molecular-based electronically switchable tunnel junction devices." Journal of the American Chemical Society 123(50): 12632-12641.
5. Cui, Y., Q. Q. Wei, et al. (2001). "Nanowire nanosensors for highly sensitive and selective detection of biological and chemical species." Science 293(5533): 1289-1292.
6. Erbe, A. and R. H. Blick (1999). "Nanomechanical resonators operating at radio frequencies." Physica B 272(1-4): 575-577.
7. Guo, L. J., P. R. Krauss, et al. (1997). "Nanoscale silicon field effect transistors fabricated using imprint lithography." Applied Physics Letters 71(13): 1881-1883.
8. Kong, J., N. R. Franklin, et al. (2000). "Nanotube molecular wires as chemical sensors." Science V287(N5453):622-625.
9. Kong, J., M. G. Chapline, et al. (2001). "Functionalized carbon nanotubes for molecular hydrogen sensors." Advanced Materials V13(N18): 1384-1386.
10. Lang, H. P., R. Berger, et al. (1998). "A chemical sensor based on a micromechanical cantilever array for the identification of gases and vapors." Applied Physics a-Materials Science & Processing 66 (PT1 SUPPS): S61-S64.
11. Mohanty, P., D. A. Harrington, et al. (2000). "Measurement of small forces in micron-sized resonators." Physica B 284(PT2): 2143-2144.

What is claimed is:
1. A device comprising:
   a substrate that includes a surface; and a plurality of nanoscale wire bodies that each have a length, said nanoscale wire bodies being located on the surface of said substrate in a parallel manner, said nanoscale wire bodies comprising:

a base portion that is attached to said substrate surface, said base portion having two edges that extend along the length of said nanoscale wire body, said two edges defining the width of said base portion; and one or more leg portions that extend along the length of said nanoscale wire body and which extend away from the said substrate, said one or more leg portions being located at one or both edges of said base portion.

2. A device according to claim 1 wherein said leg portions extend from only one edge of said base portion.

3. A device according to claim 1 wherein the width of said base portion is from about 2 nm to about 60 nanometers.

4. A device according to claim 1, wherein the distance between the edges of the adjacent base portions is from 1 nm to 100 nm.

5. A device according to claim 1, wherein said base portion is about 10 to 400 angstroms thick.

6. A device according to claim 1 wherein said wire bodies comprise material selected from the group consisting of metals, semiconductors, ceramics and organics.

* * * * *